United States Patent
Liang et al.

(10) Patent No.: US 7,000,683 B2
(45) Date of Patent: Feb. 21, 2006

(54) HEATSINK DEVICE

(75) Inventors: Chen Jiunn Liang, Taichung (TW); Kuo Yu Yu, Taichung (TW)

(73) Assignee: Min-Ching Huang, Jhongpu (TW)

( * ) Notice: Subject to any disclaimer, the term of this patent is extended or adjusted under 35 U.S.C. 154(b) by 250 days.

(21) Appl. No.: 10/647,851

(22) Filed: Aug. 22, 2003

(65) Prior Publication Data

US 2005/0041394 A1 Feb. 24, 2005

(51) Int. Cl.
*H05K 7/20* (2006.01)

(52) U.S. Cl. .................. 165/80.3; 165/185; 361/704
(58) Field of Classification Search ............. 165/80.3, 165/185; 361/697, 704, 71; 257/719, 722; 174/16.3
See application file for complete search history.

(56) References Cited

U.S. PATENT DOCUMENTS

| | | | | |
|---|---|---|---|---|
| 4,421,161 A | * | 12/1983 | Romania et al. ........... | 165/80.3 |
| 4,624,302 A | * | 11/1986 | Hayden et al. ............ | 165/80.2 |
| 4,843,693 A | * | 7/1989 | Chisholm ............. | 29/890.054 |
| 5,195,576 A | * | 3/1993 | Hatada et al. ............. | 165/80.3 |
| 5,309,321 A | * | 5/1994 | Olla et al. .................. | 361/714 |
| 5,312,508 A | * | 5/1994 | Chisholm ................... | 156/292 |
| 5,365,402 A | * | 11/1994 | Hatada et al. .............. | 361/699 |
| 5,499,450 A | * | 3/1996 | Jacoby .................... | 29/890.03 |
| 5,783,862 A | * | 7/1998 | Deeney ...................... | 257/714 |
| 6,037,658 A | * | 3/2000 | Brodsky et al. ............ | 257/707 |
| 6,043,110 A | * | 3/2000 | Davis et al. ................ | 438/118 |
| 6,121,680 A | * | 9/2000 | Chiu et al. .................. | 257/714 |
| 2002/0079097 A1 | * | 6/2002 | Lee et al. ................... | 165/185 |
| 2005/0093115 A1 | * | 5/2005 | Eytcheson .................. | 257/668 |

FOREIGN PATENT DOCUMENTS

JP 2002190557 A * 7/2002

* cited by examiner

*Primary Examiner*—Allen J. Flanigan
(74) *Attorney, Agent, or Firm*—ALan D. Kamrath; Nikolai & Mersereau, P.A.

(57) ABSTRACT

A heatsink device includes a heat conducting interface, a press plate mounted on the heat conducting interface, and a plurality of heat conducting metal threads pressed between the heat conducting interface and the press plate. Thus, the heat conducting metal threads are extended in a horizontal direction without bending or turning so as to dissipate the heat rapidly and smoothly, to prevent the heat from the heat source from being concentrated on the heat conducting interface, so that the heatsink device has the optimum heatsink effect.

7 Claims, 5 Drawing Sheets

HEATSINK DEVICE

BACKGROUND OF THE INVENTION

1. Field of the Invention

The present invention relates to a heatsink device, and more particularly to a heatsink device that can obtain the optimum heatsink effect.

2. Description of the Related Art

A conventional heatsink device 1 in accordance with the prior art shown in FIGS. 5 and 6 comprises a heat conducting interface 10, a plurality of heatsink fins 11 mounted on the heat conducting interface 10, and a cooling fan 2 mounted on the heatsink fins 11.

However, the heatsink fins 11 are arranged in a vertical manner, thereby increasing the whole height of the conventional heatsink device 1. In addition, the heatsink area of the heatsink fins 11 is small, thereby decreasing the heatsink effect.

Another conventional heatsink device 3 in accordance with the prior art shown in FIGS. 7 and 8 comprises a heat conducting interface 30, a support seat 32 mounted on the heat conducting interface 30, a cooling fan 2 mounted on the support seat 32, and a heatsink face 31 mounted on the heat conducting interface 30. The heatsink face 31 consists of a plurality of heat conducting metal thread bundles.

However, it is necessary to embed the heat conducting metal thread bundles of the heatsink face 31 into the heat conducting interface 30, thereby complicating the manufacturing process, and thereby increasing costs of fabrication. In addition, each of the heat conducting metal thread bundles of the heatsink face 31 has a substantially U-shaped profile, thereby forming turning portions, so that the heatsink face 31 cannot dissipate the heat rapidly and smoothly, thereby decreasing the heatsink effect. Further, the heat is easily concentrated on the turning portions of each of the heat conducting metal thread bundles of the heatsink face 31, thereby decreasing the heatsink effect. Further, the heatsink face 31 has a greater height, thereby increasing the whole height of the conventional heatsink device 3.

SUMMARY OF THE INVENTION

The primary objective of the present invention is to provide a heatsink device, wherein the heat conducting metal threads form a heatsink interface that can co-operate with the cooling fan to dissipate the heat from the heat source rapidly, thereby greatly enhancing the heatsink efficiency.

Another objective of the present invention is to provide a heatsink device, wherein the heat conducting metal threads are extended in a horizontal direction without bending or turning so as to dissipate the heat rapidly and smoothly, to prevent the heat from the heat source from being concentrated on the heat conducting interface, so that the heatsink device has the optimum heatsink effect.

A further objective of the present invention is to provide a heatsink device, wherein the heat conducting metal threads are sandwiched between the heat conducting interface and the press plate rigidly and stably, thereby preventing the heat conducting metal threads from detaching from the heatsink device.

A further objective of the present invention is to provide a heatsink device, wherein the heat conducting metal threads are arranged in a horizontal manner, so that the height of the heatsink device is shortened, thereby saving the space of storage, package and transportation of the heatsink device.

A further objective of the present invention is to provide a heatsink device, wherein the heat conducting metal threads are directly pressed between the heat conducting interface and the press plate by a punching process without needing other additional working process, thereby preventing the heat conducting metal threads from being worn out during the working process, so as to enhance heatsink effect.

In accordance with the present invention, there is provided a heatsink device, comprising:

a heat conducting interface;

a press plate mounted on the heat conducting interface; and a plurality of heat conducting metal threads pressed between the heat conducting interface and the press plate.

Further benefits and advantages of the present invention will become apparent after a careful reading of the detailed description with appropriate reference to the accompanying drawings.

DETAILED DESCRIPTION OF THE INVENTION

Figure 1:
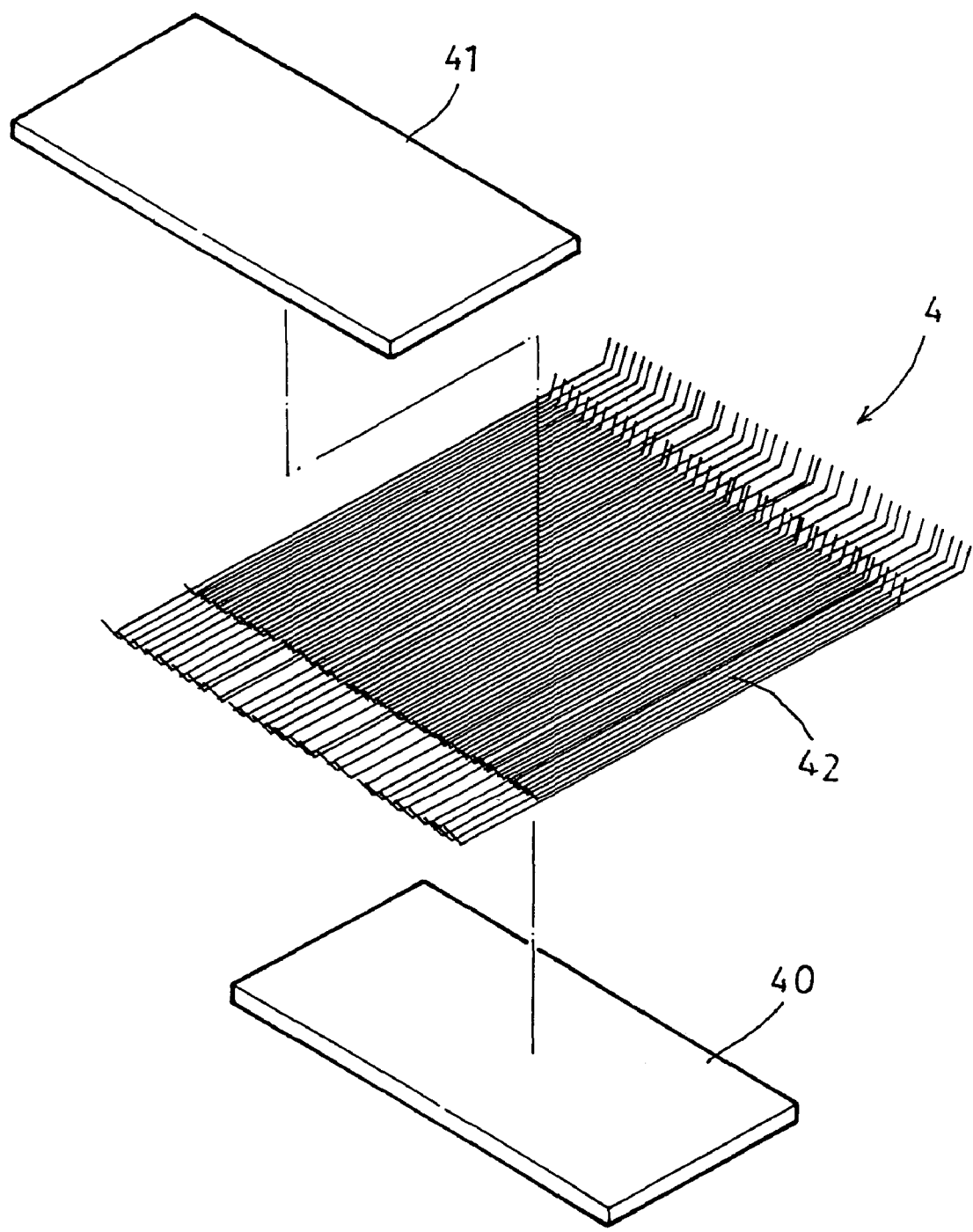
FIG. 1 is an exploded perspective view of a heatsink device in accordance with the preferred embodiment of the present invention.
Figure 2:
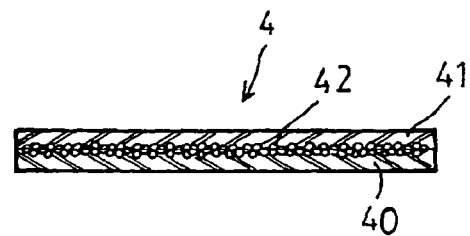
FIG. 2 is a side plan cross-sectional assembly view of the heatsink device as shown in FIG. 1.

Referring to the drawings and initially to FIGS. 1 and 2, a heatsink device 4 in accordance with the preferred embodiment of the present invention comprises a heat conducting interface 40 rested on a heat source (not shown), such as the chip of a computer or the like, a press plate 41 mounted on the heat conducting interface 40, and a plurality of heat conducting metal threads 42 sandwiched between the heat conducting interface 40 and the press plate 41. Thus, the heat conducting interface 40, the heat conducting metal threads 42 and the press plate 41 form a sandwich structure.

The heat conducting metal threads 42 are arranged in a horizontal manner and are extended in a horizontal direction. In addition, the heat conducting metal threads 42 are arranged in parallel with each other. In addition, each of the heat conducting metal threads 42 has two distal ends protruded outward from the two sides of the heat conducting interface 40 and the press plate 41 in a horizontal manner respectively. In such a manner, the heat conducting metal threads 42 form a heatsink interface.

Figure 3:
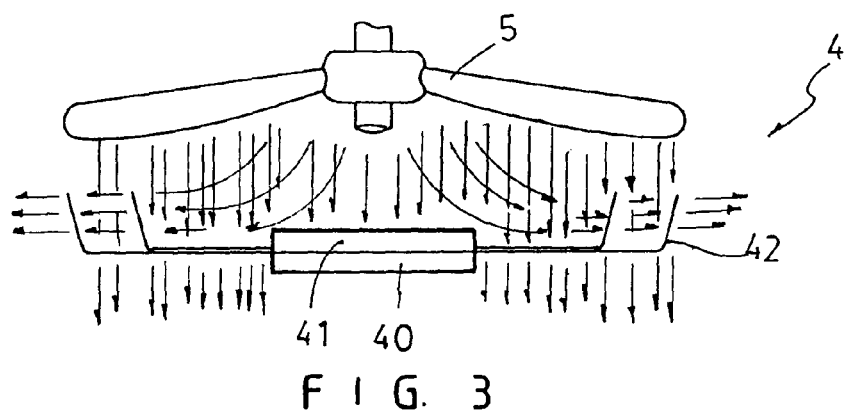
FIG. 3 is a schematic side plan operational view of the heatsink device as shown in FIG. 1 in use.
Figure 4:
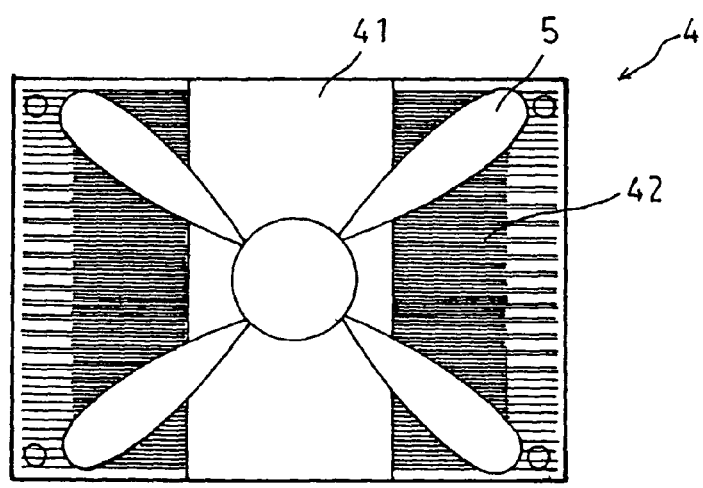
FIG. 4 is a schematic top plan operational view of the heatsink device as shown in FIG. 1 in use.
Figure 5:
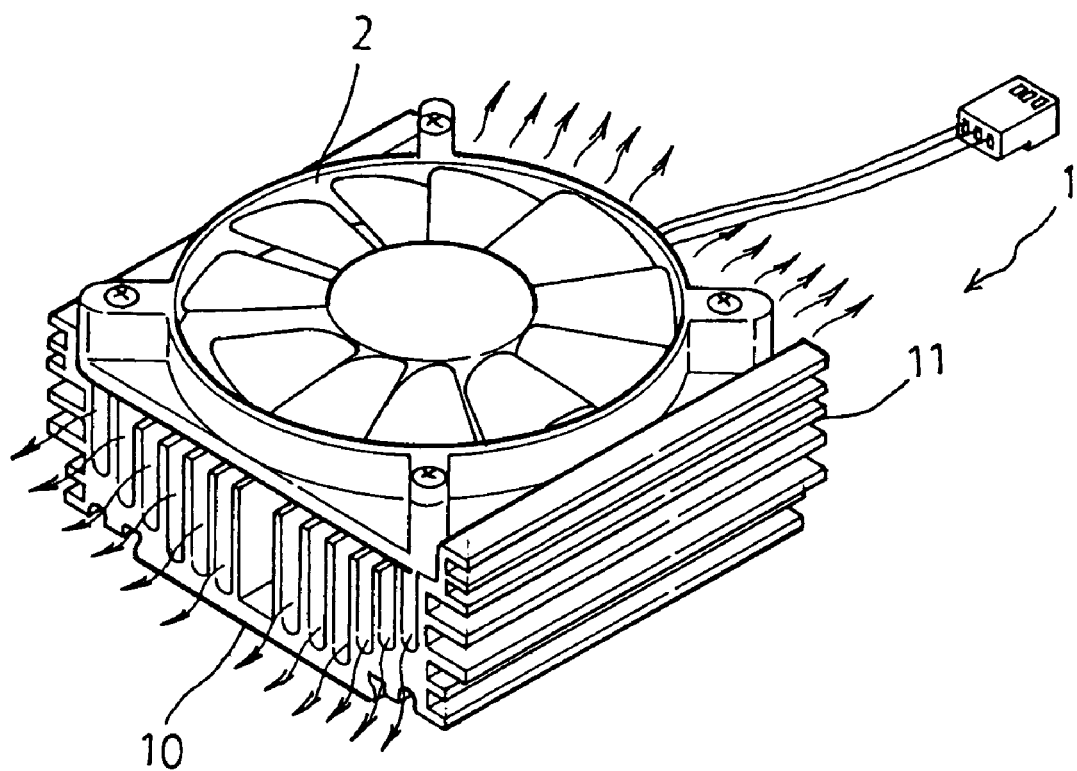
FIG. 5 is a perspective view of a conventional heatsink device in accordance with the prior art.
Figure 6:
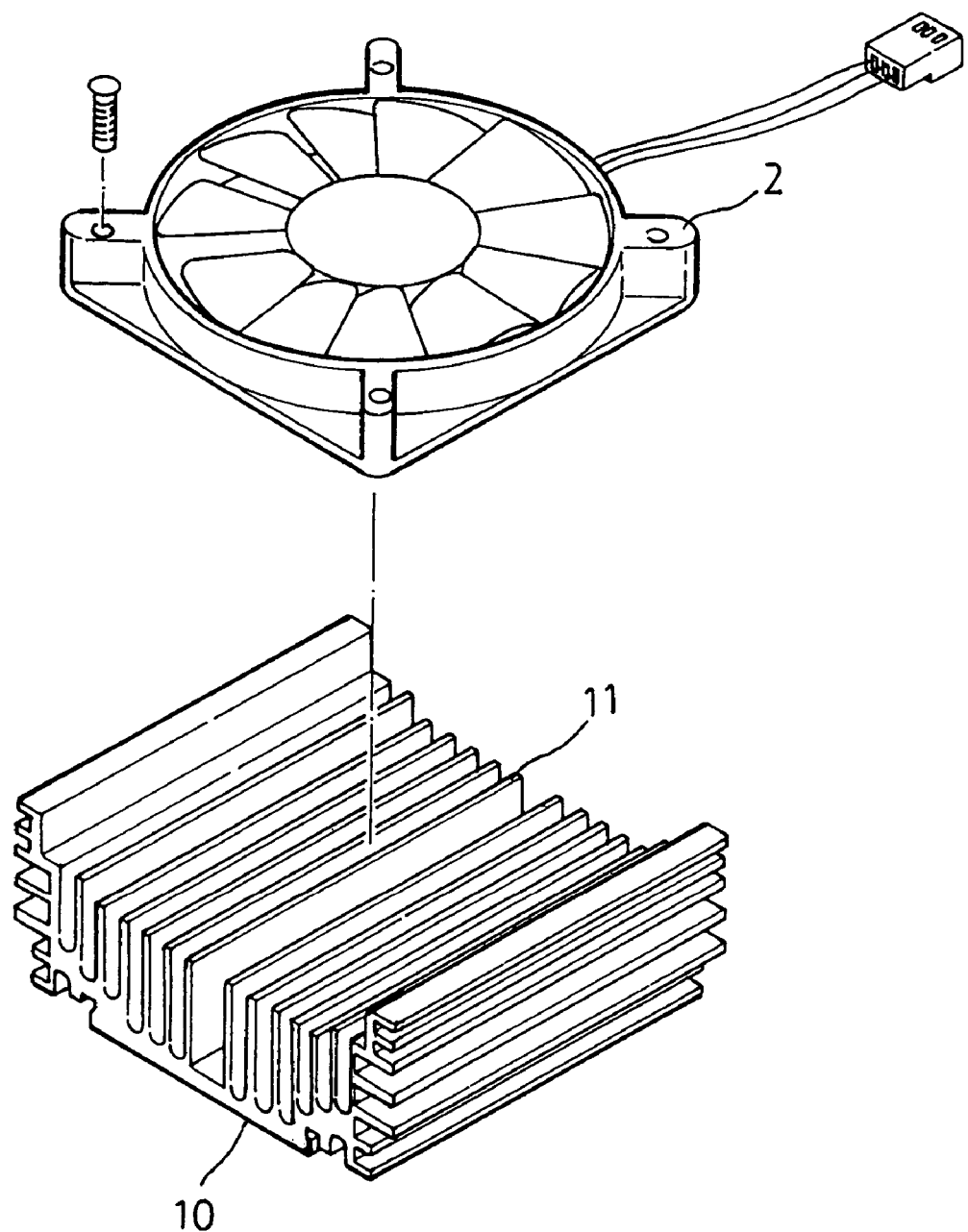
FIG. 6 is an exploded perspective view of the conventional heatsink device as shown in FIG. 5.
Figure 7:
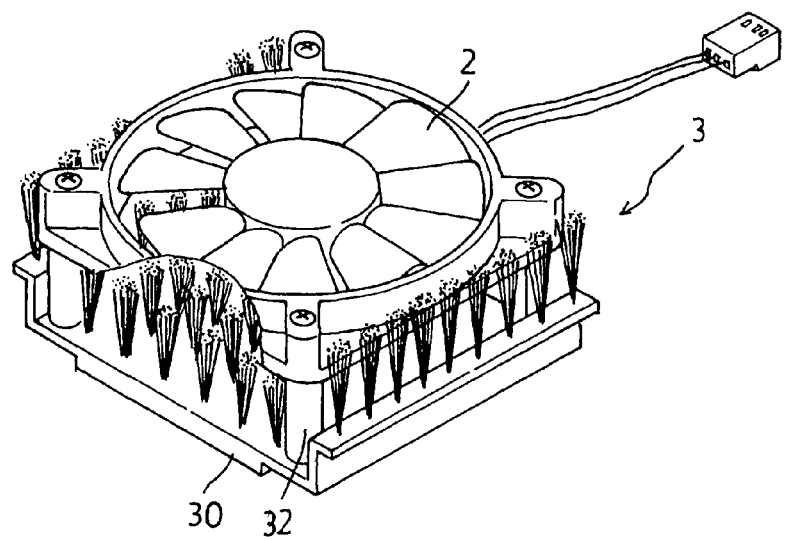
FIG. 7 is a perspective view of another conventional heatsink device in accordance with the prior art.
Figure 8:
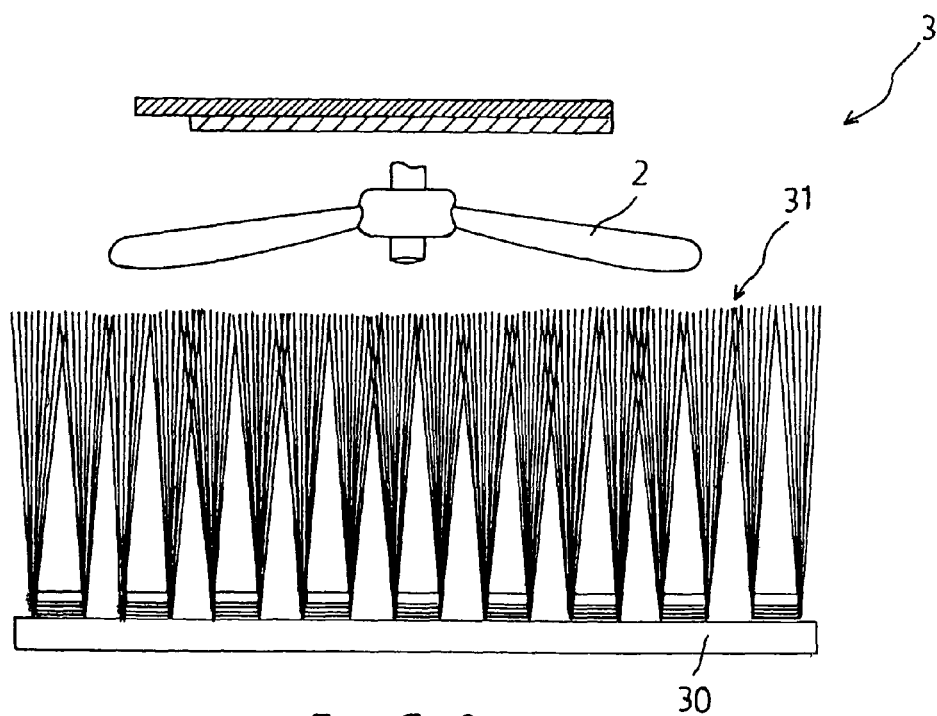
FIG. 8 is a plan cross-sectional view of the conventional heatsink device as shown in FIG. 7.

In practice, referring to FIGS. 3 and 4 with reference to FIGS. 1 and 2, the heatsink device 4 further comprises a cooling fan 5 mounted above the sandwich structure of the heat conducting interface 40, the heat conducting metal threads 42 and the press plate 41. When the heat from the heat source is conducted through the heat conducting interface 40 to the heat conducting metal threads 42, each of the heat conducting metal threads 42 can conduct the heat to the two distal ends thereof in the horizontal direction, so that the heat from the heat source can be carried away and drained outward from the two distal ends of each of the heat conducting metal threads 42 rapidly as shown in FIG. 3.

Accordingly, the heat conducting metal threads 42 form a heatsink interface that can co-operate with the cooling fan 5 to dissipate the heat from the heat source rapidly, thereby greatly enhancing the heatsink efficiency.

In addition, the heat conducting metal threads 42 are extended in a horizontal direction without bending or turning so as to dissipate the heat rapidly and smoothly, to prevent the heat from the heat source from being concentrated on the heat conducting interface 40, so that the heatsink device 4 has the optimum heatsink effect.

Further, the heat conducting metal threads 42 are sandwiched between the heat conducting interface 40 and the press plate 41 rigidly and stably, thereby preventing the heat conducting metal threads 42 from detaching from the heatsink device 4.

Further, the heat conducting metal threads 42 are arranged in a horizontal manner, so that the height of the heatsink device 4 is shortened, thereby saving the space of storage, package and transportation of the heatsink device 4.

Further, the heat conducting metal threads 42 are directly pressed between the heat conducting interface 40 and the press plate 41 by a punching process without needing other additional working process, thereby preventing the heat conducting metal threads 42 from being worn out during the working process, so as to enhance heatsink effect.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A heatsink device, comprising:
   a heat conducting interface;
   a press plate mounted on the heat conducting interface; and
   a plurality of heat conducting metal threads pressed between the heat conducting interface and the press plate; wherein
   each of the heat conducting metal threads has two distal ends protruded outward from the two sides of the heat conducting interface and the press plate respectively.

2. The heatsink device in accordance with claim 1, wherein the heat conducting interface, the heat conducting metal threads and the press plate form a sandwich structure.

3. The heatsink device in accordance with claim 1, wherein the heat conducting metal threads are arranged in a horizontal manner.

4. The heatsink device in accordance with claim 1, wherein the heat conducting metal threads are extended in a horizontal direction.

5. The heatsink device in accordance with claim 1, wherein the heat conducting metal threads are arranged in parallel with each other.

6. The heatsink device in accordance with claim 1, wherein the two distal ends of each of the heat conducting metal threads are protruded outward from the two sides of the heat conducting interface and the press plate in a horizontal manner.

7. The heatsink device in accordance with claim 1, wherein the heat conducting metal threads form a heatsink interface.

\* \* \* \* \*